United States Patent [19]

Nakamura et al.

[11] Patent Number: 5,314,540
[45] Date of Patent: May 24, 1994

[54] APPARATUS FOR FORMING DIAMOND FILM

[75] Inventors: Satoshi Nakamura, Aichi; Minoru Yamamoto, Kariya; Nobuei Ito, Chiryu; Tadasi Hattori, Okazaki, all of Japan

[73] Assignee: Nippondenso Co., Ltd., Kariya, Japan

[21] Appl. No.: 855,742

[22] Filed: Mar. 23, 1992

[30] Foreign Application Priority Data

| Mar. 22, 1991 | [JP] | Japan | 3-58824 |
| Mar. 22, 1991 | [JP] | Japan | 3-58825 |
| Mar. 22, 1991 | [JP] | Japan | 3-58826 |
| Mar. 22, 1991 | [JP] | Japan | 3-58827 |

[51] Int. Cl.$^5$ .............. C23C 16/00; C23C 16/50
[52] U.S. Cl. .............. 118/723 DC; 118/723 R
[58] Field of Search ............ 118/723, 723 R, 723 DC, 118/723 E; 219/48, 52, 53, 59; 156/DIG. 68; 427/577, 580

[56] References Cited

U.S. PATENT DOCUMENTS

| 4,767,608 | 8/1988 | Matsumoto et al. ... | 156/DIG. 68 X |
| 4,830,702 | 5/1989 | Singh et al. ............. | 156/DIG. 68 X |
| 4,851,254 | 7/1989 | Yamamoto et al. ....... | 427/37 |
| 5,094,878 | 3/1992 | Yamamoto et al. ....... | 427/580 X |
| 5,099,788 | 3/1992 | Ito et al. ................ | 118/723 X |

FOREIGN PATENT DOCUMENTS

| 60-127292 | 7/1985 | Japan . |
| 1164796 | 6/1989 | Japan . |
| 2-160696 | 6/1990 | Japan .............. 156/DIG. 68 |
| 2-217396 | 8/1990 | Japan .............. 156/DIG. 68 |
| 388799 | 4/1991 | Japan . |
| 3131598 | 6/1991 | Japan . |

OTHER PUBLICATIONS

JSAP Catalog No.: AP 901110-02, 28a-ZK-6, Mar. 1990.

Primary Examiner—William A. Powell
Assistant Examiner—Jonathan D. Baskin
Attorney, Agent, or Firm—Cushman, Darby & Cushman

[57] ABSTRACT

Apparatus and process for synthesizing a diamond film of high purity at a high rate. Mixture gas of hydrocarbon gas and hydrogen gas is introduced into an arc discharge to produce a gas plasma. This gas plasma is blown against a substrate to deposit diamond. A plasma current power supply is connected with a third electrode disposed above the substrate to place the third electrode at a positive potential. An electrical current is supplied into the gas plasma from the third electrode. Flow of the electrical current through the plasma promotes the decomposition of the hydrogen and hydrocarbon. A diamond film of high purity can be deposited at a high rate. The invention is characterized in that the substrate is placed at a lower potential than the third electrode or the direction of the electrical current intersects the flow of the gas plasma although the electrical current is passed through the plasma. Therefore, it is unlikely that the accelerated electrons reach the substrate, elevating its temperature. Hence, diamond of high quality can be synthesized.

18 Claims, 19 Drawing Sheets

APPARATUS FOR FORMING DIAMOND FILM

BACKGROUND OF THE INVENTION

1. Field of the Invention

The present invention relates to an apparatus and process for forming a diamond film and, more particularly, to an apparatus and process for synthesizing a diamond film out of a vapor phase by making use of an arc discharge.

2. Description of the Prior Art

In recent years, various processes have been proposed as methods of synthesizing diamond films out of a vapor phase at low pressures. One process is the hot filament CVD. In particular, a tungsten filament is placed just above a substrate which is heated to 800° to 1000° C. The filament is heated above 2000° C. Hydrogen and a hydrocarbon gas (e.g., $CH_4$) are blown against the substrate through the filament to grow a diamond film on the substrate.

Another known process is the microwave plasma CVD. In this process, a plasma is produced within a mixture gas of hydrogen gas and hydrocarbon gas by application of microwaves of several hundred watts. A diamond is grown on the substrate placed within the plasma. The substrate is heated to about 700° to 900° C. by the microwaves.

In these two processes for synthesizing diamond, hydrogen atoms act to promote decomposition of $CH_4$ and to selectively etch synthesized materials other than the diamond such as amorphous carbon. In this way, hydrogen atoms play an important role. However, the hot filament CVD is not practical, because the heated filament often breaks. When the melting point of tungsten is taken into account, the filament cannot be heated above about 2000° C. If the filament is heated above this temperature, the filament wire will break. As a result, the raw material gases cannot be decomposed sufficiently. In the process utilizing a microwave plasma, limitations are imposed on the dimensions of the plasma chamber. Therefore, it is difficult to apply this process to a sample having a large area. In addition, the raw material gases, especially hydrogen, are not decomposed sufficiently.

A further process available uses an ion beam. In this process, a beam of carbon ions is caused to bombard a substrate to grow a diamond film. Unfortunately, the produced diamond contains a large amount of impurities such as amorphous carbon.

A process utilizing an arc discharge has been proposed in U.S. Pat. No. 4,851,254. Specifically, an arc discharge is induced between opposite electrodes. The raw material gases are passed through the arc discharge to create a gas plasma. This gas plasma is narrowed down by a restrictor portion and blown as a plasma jet gas against a substrate. Thus, diamond is deposited on the substrate.

This method of synthesizing diamond by making use of an arc discharge can indeed provide a greatly improved synthesis rate, but the ratio of the hydrocarbon introduced for improving the purity of the diamond film to the hydrogen must be decreased. This lowers the synthesis rate. More specifically, as can be seen from the graph of FIG. 18, as the ratio of the hydrocarbon to hydrogen is decreased, the thermal diffusivity of the synthesized diamond film, or the purity, is improved but the synthesis rate drops.

Another problem with this process using an arc discharge is that the gases are not sufficiently dissociated near the substrate against which the raw material gases are blown. Specifically, the use of the arc discharge greatly improves the gas decomposition rate, but this improvement is accomplished only around the generated arc discharge. The gas decomposition rate is much lower around the substrate against which the plasma jet gas is blown because of recombination and other reactions. In FIG. 19, the spectral intensity of the emission spectrum $H\beta$ of hydrogen Balmer series representing the amount of the hydrogen radicals, or the decomposed hydrogen, is plotted against the distance from the nozzle, or the plasma ejection port, to the substrate. As can be understood from this graph, the gas decomposition rate drops rapidly away from the plasma ejection port. That is, the decomposition rate is much lower around the substrate.

Bringing the substrate close to the plasma ejection port to synthesize the diamond at positions of high gas decomposition rates may be contemplated. However, this elevates the substrate temperature, rapidly increasing the amount of impurity carbons other than diamond such as graphite. This is because the appropriate temperature of the substrate for the synthesis of a diamond is between 600° C. and 1100° C. and because the optimum temperature for high-purity synthesis is between 800° C. and 1000° C. Therefore, in order to synthesize a diamond at a higher efficiency, it is necessary to enhance the gas decomposition rate around the substrate without elevating the substrate temperature.

SUMMARY OF THE INVENTION

In view of the foregoing problems, it is an object of the present invention to provide an apparatus and process capable of synthesizing a diamond film of high quality at a high efficiency.

An apparatus for fabricating a diamond film in accordance with the present invention comprises: a vacuum vessel the inside of which is maintained at a given degree of vacuum; positive and negative electrodes disposed opposite to each other inside the vacuum vessel; an arc discharge power supply which is electrically connected with the positive and negative electrodes and supplies a given electric power to produce an arc discharge within the space located between the electrodes; a gas supply means which supplies raw material gases including hydrogen and carbon to the arc discharge to produce a gas plasma and which blows this gas plasma against a substrate located downstream of the plasma; a third electrode disposed between the substrate and the region in which the gas plasma is produced; a plasma current power supply for supplying an electrical current from the third electrode into the gas plasma; and an inhibiting means which prevents flow of positive electrical current from the substrate to the third electrode.

A process for forming a diamond film in accordance with the present invention involves passing raw material gases including hydrogen and carbon through an arc discharge to produce a gas plasma and blowing this gas plasma against a substrate located downstream of the plasma to deposit a diamond film on the substrate. A third electrode is disposed between the substrate and the region in which the gas plasma is produced. An electric field is set up to place the third electrode at a high potential to pass an electrical current between the third electrode and the region in which the gas plasma is produced while preventing flow of positive electrical current from the substrate to the third electrode.

Other objects and features of the invention will appear in the course of the description thereof which follows.

DESCRIPTION OF THE PREFERRED EMBODIMENTS

Figure 1:
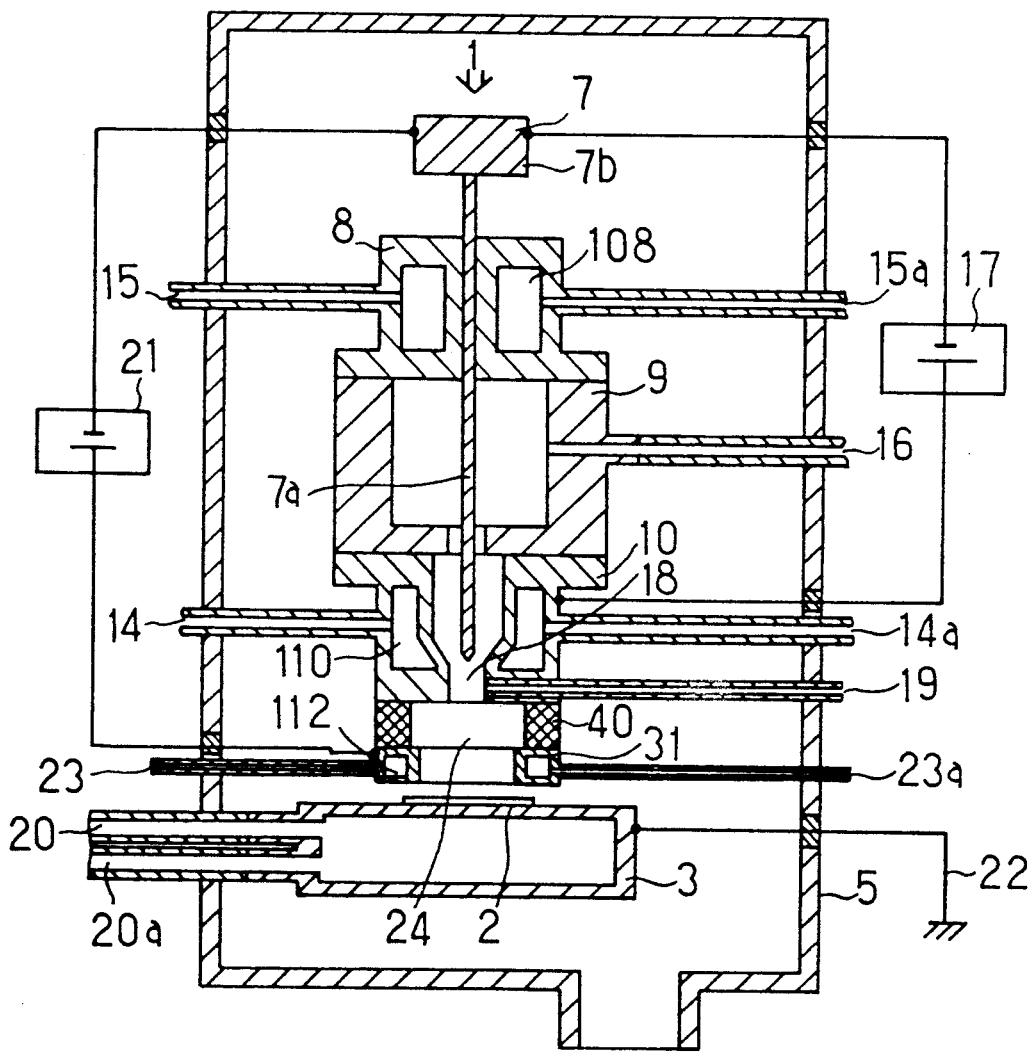
FIG. 1 is a cross-sectional view of a diamond film-forming apparatus according to the present invention.

Referring to, FIG. 1, there is shown a fabrication apparatus according to the invention. This apparatus comprises a vacuum vessel 5 in which a plasma jet gun 1, an annular insulator 40 made of boron nitride, an annular positive electrode 31 (or a third electrode) made of copper, a substrate 2, and a substrate support 3 made of copper are housed. The inside of the vacuum vessel 5 is maintained at a desired pressure between 5 Torr and 5 atm.

The plasma jet gun 1 comprises a rodlike electrode 7 made of tungsten, an electrode-cooling portion 8 made of copper, a gas inlet portion 9 made of Teflon, and a cylindrical electrode 10 made of copper. The rodlike electrode 7 is located in the center of the gun 1 and has a front end portion 7a having a sharp end. A flange 7b is formed on the rodlike electrode 7 in an opposite relation to the sharp end. The electrode-cooling portion 8, the gas inlet portion 9, and the cylindrical electrode 10 are arranged in that order from the side of the flange 7b. The electrode-cooling portion 8 and the cylindrical electrode 10 are provided with hollow portions 108 and 110, respectively. A cooling water pipe 14 is connected with the cylindrical electrode 10 to supply cooling water into the cylindrical electrode. The water then f lows out of the hollow portion 110 of this electrode 10 into another cooling water pipe 14a. Similarly, cooling water is supplied into the hollow portion 108 of the electrode-cooling portion 8 from a cooling water pipe 15 connected with the electrode-cooling portion 8. The water is discharged from a cooling water pipe 15a connected with the electrode-cooling portion 8. Wear of the electrodes due to heat produced by the arc discharge generated between the rodlike electrode 7 and the cylindrical electrode 10 is prevented by the cooling water. The gas inlet portion 9 has a raw material gas inlet pipe 16. An opening is formed at one side of the rodlike electrode 7 to permit the gas supplied from the inlet pipe 16 to be forced toward the front end portion 7a.

In order to induce an arc discharge between the rodlike electrode 7 and the cylindrical electrode 10, these two electrodes are connected to an arc discharge power supply 17. To effectively produce the arc discharge, the power supply 17 is connected so that the rodlike electrode 7 having the sharp front end portion 7a is placed at a negative potential. A plasma ejection port 18 is formed in the surface of the cylindrical electrode 10 that is opposite to the gas inlet portion 9, to narrow down the gas plasma, thus forming a plasma jet gas. The annular insulator 40 and the annular positive electrode 31 are disposed to form a plasma passage 24 which is in communication with the plasma ejection port 18. A carbon source gas inlet pipe 19 extends into the plasma ejection port 18.

The annular positive electrode 31 is disposed downstream of the plasma ejection port 18 at or near the position at which the diameter of the plasma jet gas assumes its maximum value C. This position is determined by the length of the annular insulator 40. The inside diameter of the annular insulator 40 of boron nitride and the inside diameter of the annular positive electrode 31 of copper are set larger than the diameter of the plasma ejection port 18. Especially, the inside diameter A of the positive electrode 31 is set so that the relation $A \leqq 5B$ holds, where B is the inside diameter of the plasma ejection port 18 as described later. A plasma current power supply 21 is electrically connected between the rodlike electrode 7 and the positive electrode 31 to apply an electric field between these electrodes 7 and 31 so that an electrical current exceeding a given value may flow from the positive electrode 31 to the rodlike electrode 7 through the plasma.

The annular positive electrode 31 has a hollow portion 112. Cooling water is supplied into the hollow portion 112 from a cooling water inlet pipe 23 and discharged into a cooling water discharge pipe 23a. The cooling water cools the positive electrode 31 to suppress the heating of the annular electrode 31 due to the electrical current flowing between the rodlike electrode 7 and the positive electrode 31. Hence, the positive electrode 31 is prevented from wearing down.

The substrate support 3 is mounted via the annular insulator 40 and the annular positive electrode 31 downstream of the plasma ejection port 18. The substrate 2 is placed on this support 3 which is made hollow so that cooling water may be supplied into the support 3 from a cooling water pipe 20 and discharged from another cooling water pipe 20a, for maintaining the substrate at a desired temperature, in the present embodiment about 800° C., for the following reason. The gas temperature of the plasma jet ejected from the plasma ejection port 18 reaches several thousand to tens of thousand degrees and, therefore,, it is necessary to cool the substrate temperature down to 600° to 1100° C., at which temperatures diamond can be synthesized. The substrate support 3 is grounded by a conductor 22, or an inhibiting means, for setting the substrate potential. In this way, the substrate 2 is placed at ground potential.

Diamond can be synthesized where the distance between the annular positive electrode 31 and the substrate 2 is 10 to 100 mm and the distance between the positive electrode 31 and the region in which the gas plasma is produced is 5 to 100 mm. In the present embodiment, the distance between the plasma ejection port 18 and the substrate 2 is 40 mm. In order to deposit diamond of high purity, the annular positive electrode 31 is mounted coaxially with the plasma ejection port 18 at a distance of 20 mm above the substrate 2. Also, in the present embodiment, the inside diameter of the plasma ejection port 18 is 4 mm. The inside diameter of the annular electrode 31 is 10 mm.

In the present embodiment, a diamond film is synthesized in the manner described before. First, the inside of the vacuum vessel 5 is evacuated. Then, argon gas which has a high degree of ionization and belongs to Group 0 of the Periodic Table is admitted into the plasma jet gun 1 from the gas inlet pipe 16. The pressure inside the vacuum vessel 5 is maintained at 40 Torr. Subsequently, the arc discharge power supply 17 produces an arc discharge between the rodlike electrode 7 acting as a negative electrode and the cylindrical electrode 10 serving as a positive electrode. For this purpose, RF waves are applied between the electrodes 7 and 10, or a spark discharge is produced with an igniter or the like and then a transition is made from this spark discharge to an arc discharge. In the present embodiment, the arc discharge is created at a voltage of 40 V and a current of 60 A.

After the discharge has stabilized, mixture gas of 50% by volume of argon and 50% by volume of $H_2$ is caused to flow through the arc discharge as plasma source gases from the gas inlet pipe 16 at a flow rate of 12 m/min. In this manner, a gas plasma is generated. This gas plasma is passed through the restrictor of the plasma ejection port 18 to give rise to a plasma jet. Mixture gas of methane gas (240 m/min. ) and hydrogen gas (60 m/min.) is introduced from the carbon source gas inlet port 19. The hydrocarbon gas which acts as a carbon source gas and is typified by methane gas may be introduced from the gas inlet pipe 16. Since there is a possibility that the tungsten electrode rod is carbonized and the electric discharge does not persist stably for a long time, it is desired to form a gas inlet port downstream of the electric discharge region and to introduce the hydrocarbon gas from this port. The methane gas introduced from this carbon gas inlet port 19 is blown against the plasma jet gas of the plasma source gases to form a plasma jet gas. In the present embodiment, the maximum diameter C of the plasma jet gas is approximately 20 mm. The pressure inside the vacuum vessel 5 is appropriately evacuated such that it is maintained at 40 Torr.

An electric field is applied between the rodlike electrode 7 and the annular positive electrode 31 by the plasma current power supply 21 that is a DC power supply. In the present embodiment, a voltage of 60 V is applied. An electrical current exceeding 20 A, e.g. , 40 A, is caused to flow through the plasma. The substrate support 3 is grounded, so that the substrate 2 is placed at ground potential.

Under this condition, the purple plasma jet gas is blown against the substrate 2 to deposit diamond on the substrate 2. In the present embodiment, the temperature at the center of the plasma is in excess of 3000° C. The temperature in the electric discharge portion inside the gun is still higher.

Diamond was synthesized on the substrate 2 in practice for 30 minutes under these conditions. The substrate 2 was made of a metal plate of tungsten. The surface of this plate had been previously mirror-polished so that a diamond film could easily make intimate contact with it, or very fine craws had been previously formed by polishing to facilitate synthesizing diamond. The deposit on the substrate 2 was observed with a Raman spectrometer and an electron microscope.

FIG. 2(a) shows a Raman spectrum derived from this deposit. FIG. 2(b) shows a Raman spectrum obtained from a comparative sample which was formed similarly to the deposit except that no electric field was applied from the plasma current power supply 21 shown in FIG. 1.

Figure 2:
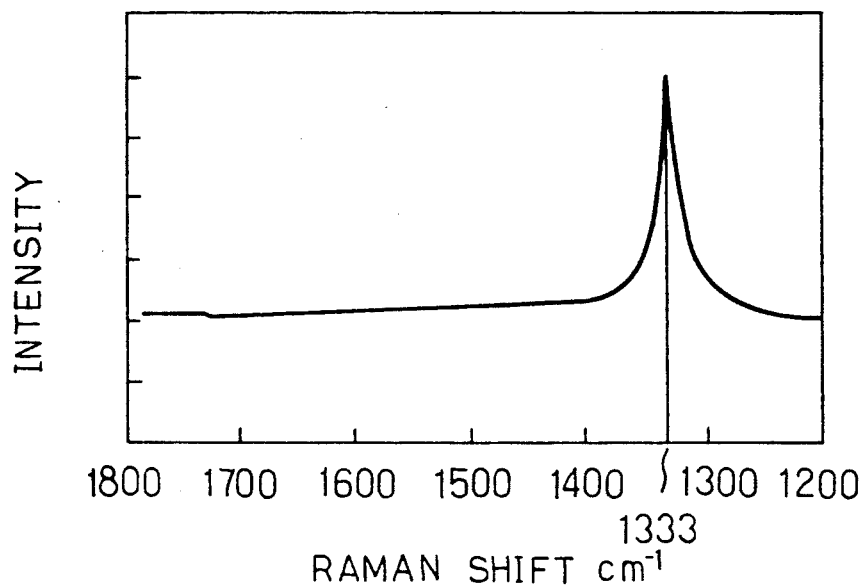
FIG. 2(a) is a graph showing a Raman spectrum obtained from a sample synthesized by the apparatus shown in FIG. 1.
FIG. 2(b) is a graph showing a Raman spectrum obtained from a sample synthesized by the apparatus shown in FIG. 1 without passing electrical current from the annular positive electrode into the gas plasma.
Figure 2:
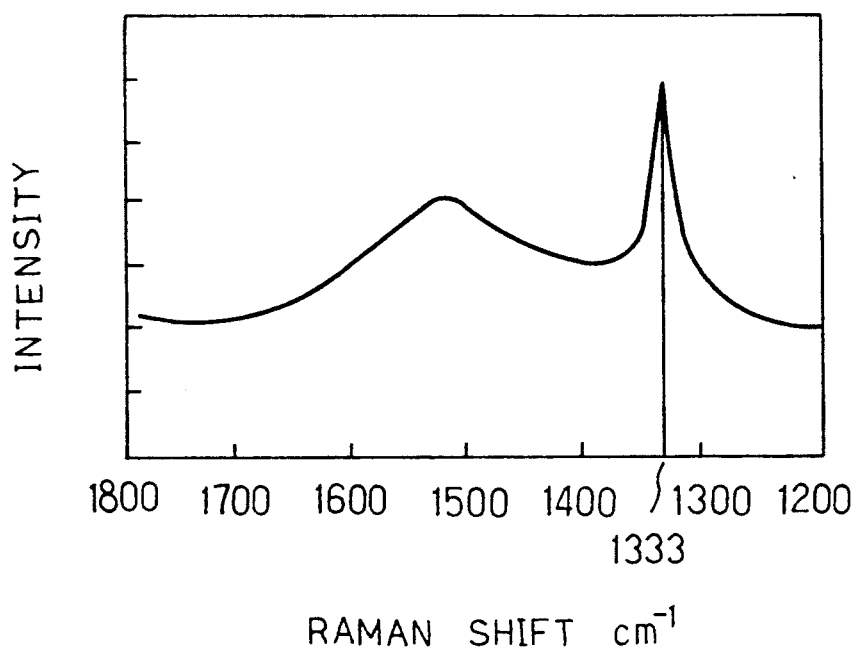

As can be seen from FIG. 2(a), a Raman spectral peak in the neighborhood of 1333 cm$^{-1}$ representing the presence of diamond was observed. A broad peak at 1400 to 1600 cm$^{-1}$ representing amorphous graphite, i-carbon, and other carbons appeared on the Raman spectrum of FIG. 2(b). The results indicated in FIG. 2, (a) and (b), reveal that a diamond film of high purity can be deposited by applying an electric field with the plasma current power supply 21. A crystalline particle image was observed with an electron microscope. The crystalline morphology was similar to the morphology of diamond particles synthesized by microwave plasma CVD.

We performed an experiment for synthesizing a diamond film by the known microwave plasma CVD.

The synthesis rate was 0.3 μm/h. The synthesis rate achieved by the present embodiment was 100 μm/h. In this way, a diamond film can be formed at a sufficiently high rate in the present embodiment.

In the present embodiment, a diamond film of high purity can be deposited at a high rate by applying an electric field between the rodlike electrode 7 and the annular positive electrode 31 with the plasma current power supply 21 to supply an electrical current into the plasma. The present inventors and others have considered the reason as follows.

In the process for synthesizing a diamond film by making use of an arc discharge, the gases are sufficiently broken down by the thermal energy of the arc discharge. Generally, the gases utilized are hydrocarbon and hydrogen. When the roles of the gases are considered, the hydrocarbon is decomposed into diamond, graphite, amorphous carbon, and i-carbon by the plasma. On the other hand, hydrogen is considered to be decomposed into hydrogen radicals, hydrogen ions, etc. by the plasma. Since the hydrogen radicals have a large reducing power, they act to reduce carbon back to gaseous methane. That is, the hydrogen radicals reduce the diamond, graphite, amorphous carbon, i-carbon, etc. produced by plasma decomposition of the hydrocarbon.

The above-described diamond, graphite, amorphous carbon, and i-carbon are reduced by the hydrogen radicals to different degrees. Diamond is removed much less than graphite, amorphous carbon, and i-carbon. Accordingly, carbons other than diamond, i.e., graphite, amorphous carbon, and i-carbon are apparently selectively removed in the synthesis of diamond utilizing plasma decomposition. As a result, only diamond is synthesized.

Figure 4:
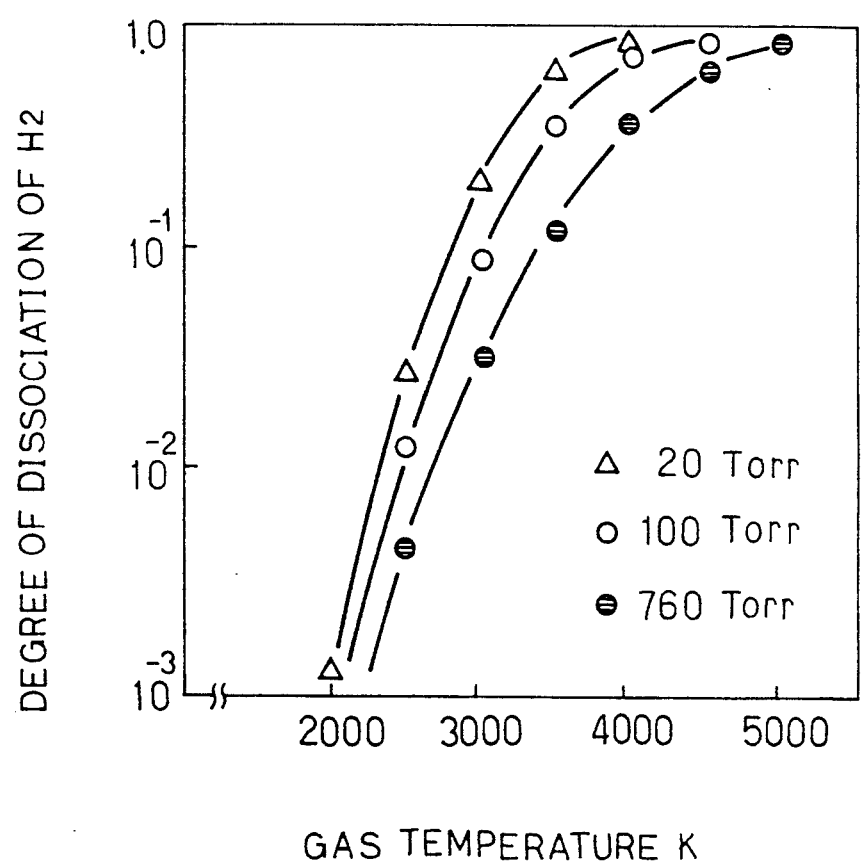
FIG. 4 is a graph showing the relation of the degree of dissociation of hydrogen to gas temperature.

Therefore, in order to improve the synthesis rate and the purity of diamond, an improvement in the decomposition or dissociation of hydrogen and hydrocarbon is needed in addition to an increase in the amount of the introduced hydrocarbon. We calculated the degree of dissociation of hydrogen for gas temperature, based on statistical mechanics. The results are shown in FIG. 4. It can be seen from this graph that only a few percent of hydrogen dissociates at temperatures of two thousand several hundred K which are attained by a thermal filament. To dissociate hydrogen at a high ratio, it is necessary that the gas temperature be in excess of 3000 K. The arc discharge is produced within a pressure range from several Torr to several atm. A high-density electrical current flows through the space in spite of the fact that the potential difference between the opposite electrodes is as low a few tens of volts. Hydrogen can be sufficiently dissociated, because gas temperatures between several thousand to tens of thousand K are obtained.

The plasma current power supply 21 applies an electric field between the rodlike electrode 7 and the annular positive electrode 31. Thus, the electrons flowing through the gas plasma are accelerated toward the positive electrode 31 and possess higher energies. These electrons collide against hydrogen and hydrocarbons. The energies of the electrons are absorbed by the hydrogen and hydrocarbons. The result is that the hydrogen and hydrocarbons are easily decomposed and dissociated. As a consequence, a diamond film of high purity can be deposited at a high rate.

Figure 3:
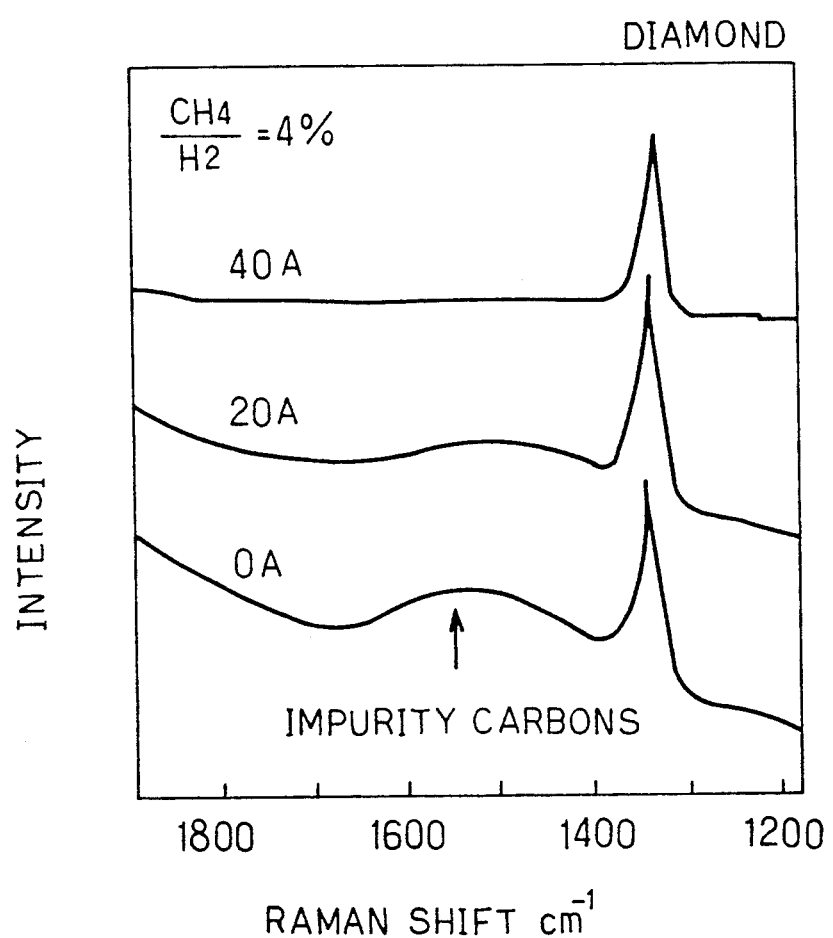
FIG. 3 is a graph showing Raman spectra obtained from samples synthesized by the apparatus shown in FIG. 1 with various values of electrical current passed from the third electrode into the gas plasma.

FIG. 3 shows Raman spectra obtained with several values of the electrical current applied between the rodlike electrode 7 and the annular positive electrode 31. As can be seen from this graph, the broad peak at 1400 to 1600 cm$^{-1}$ almost disappears when the applied electrical current exceeds 20 A. Consequently, a high-purity diamond film can be obtained.

Figure 6:
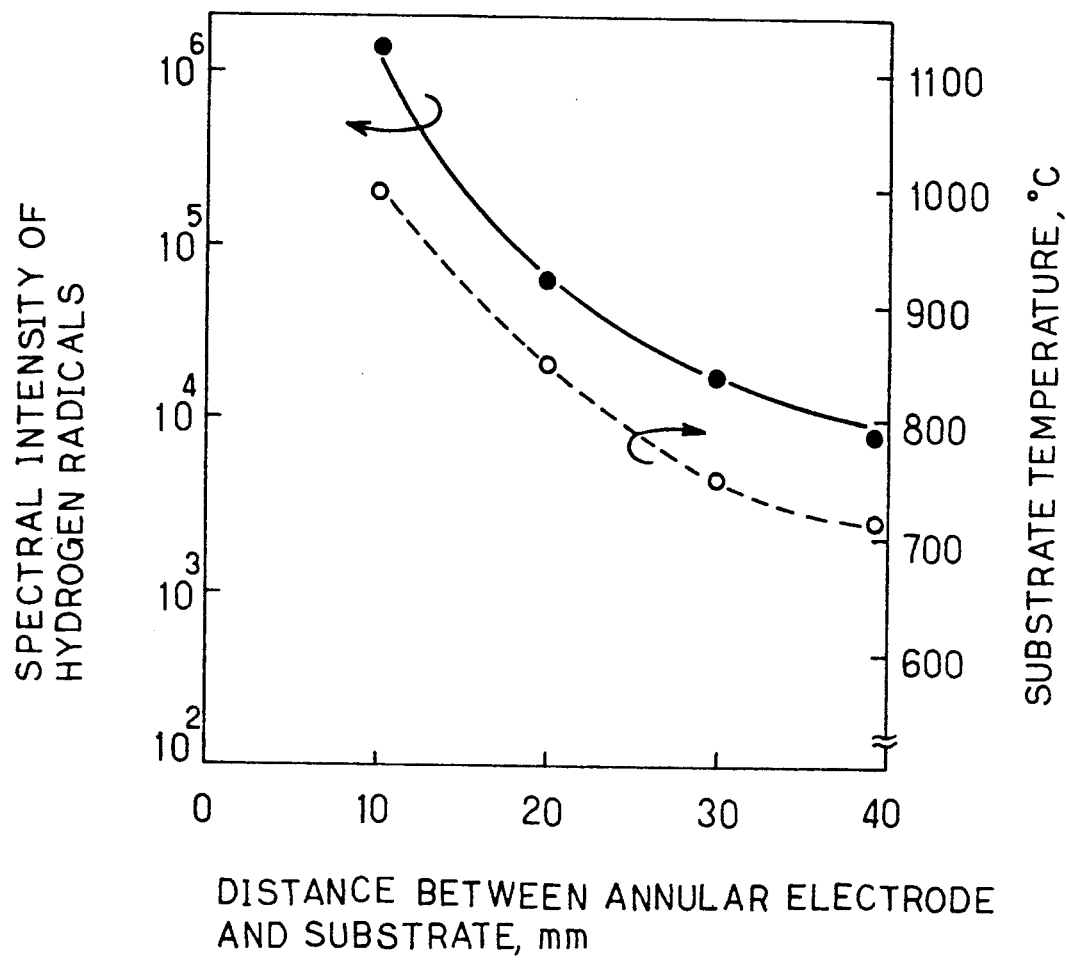
FIG. 6 is a graph in which the intensity of a hydrogen spectrum obtained from a diamond film synthesized by the apparatus shown in FIG. 1 and the substrate temperature are plotted against the distance between the annular positive electrode and the substrate, the spectrum intensity representing the dissociation of hydrogen at a height of 5 mm above the substrate.

The electrical current is passed through the plasma. As the value of the current increases, the purity of the deposited diamond film and the synthesis rate are improved. However, if the electrical current flowing through the plasma is increased, the accelerated electrons reach the substrate 2. As a result, the substrate temperature may rise above the aforementioned diamond synthesis range of 600° to 1100° C. In the present embodiment, the substrate is placed at ground potential and so no positive current flows from the substrate 2 to the annular electrode 31. Hence, the substrate temperature is prevented from rising excessively.

Where the amount of the electrical current flowing through the plasma is smaller, less electrons participate in the dissociation of hydrogen. Consequently, the effect on the hydrogen dissociation is smaller. In this case, bringing the annular positive electrode 31 close to the substrate 2 may be contemplated to effect the hydrogen dissociation near the substrate. However, as shown in FIG. 6, the substrate temperature rises, creating the possibility that the amount of the impurity carbons other than diamond such as graphite increases rapidly as mentioned above. In FIG. 6, the substrate temperature is plotted against the distance between the annular positive electrode 31 and the substrate 2 where an electrical current of 40 A is passed through the plasma. Also, the degree of dissociation of hydrogen at a height of 5 mm above the substrate 2 is plotted against this distance.

The present inventors and others tried to set the electrical current flowing through the plasma to the range best suited for production of a high-purity diamond film without resorting to bringing the annular positive electrode 31 close to the substrate 2, and conducted numerous experiments. As a result, we have discovered that a diamond film of high purity is created if an electrical current exceeding 20 A is passed through the plasma. The annular positive electrode 31 is placed around the plasma jet gas ejected from the plasma ejection port 18. Let D be the maximum diameter of the plasma jet gas between the annular electrode 31 and the plasma ejection port 18. The maximum diameter D is equal to or smaller than the maximum diameter C of the plasma jet gas, i.e., $D \leq C$. The current density should be in excess of about $20/D^2$. This relation is shown in FIG. 5.

Figure 5:
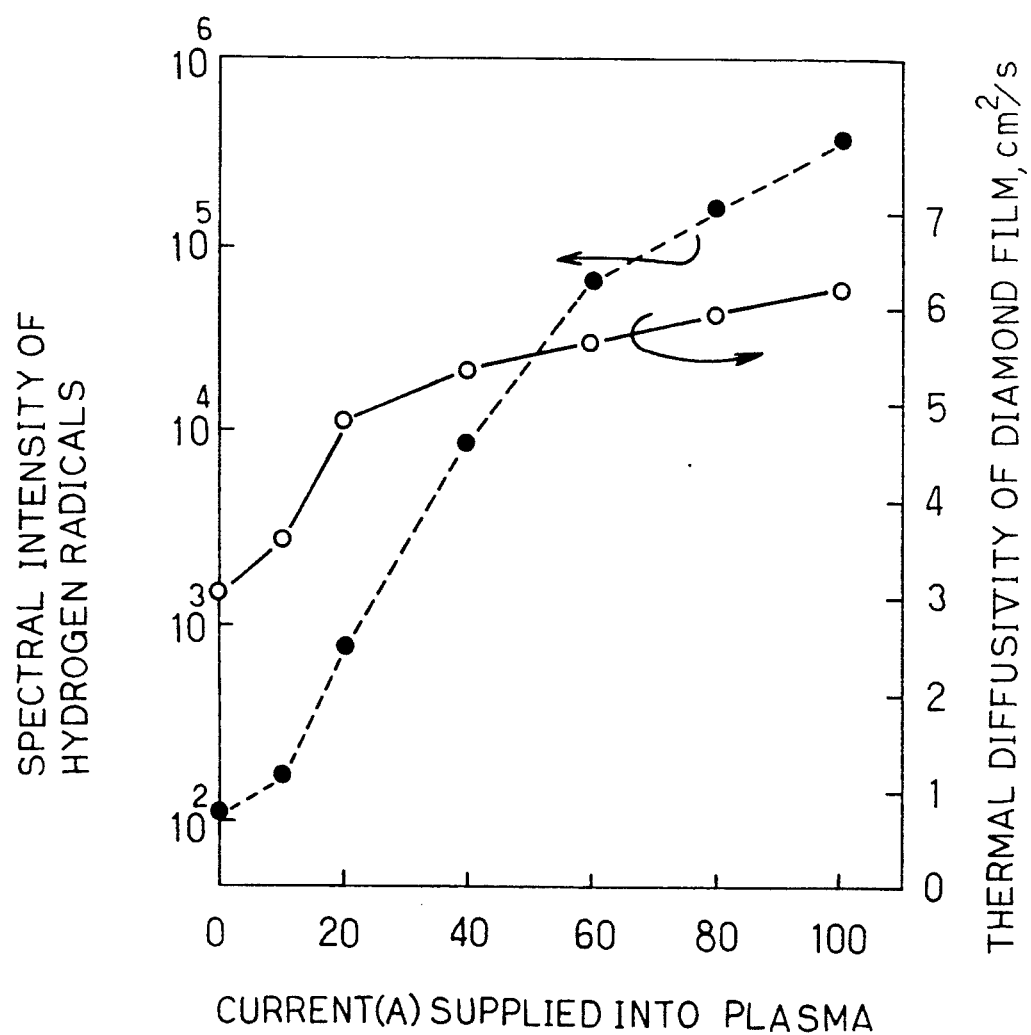
FIG. 5 is a graph in which the intensity of a hydrogen spectrum obtained from a diamond film synthesized by the apparatus shown in FIG. 1 and the thermal diffusivity of the diamond film are plotted against the electrical current passed into the plasma, the spectrum intensity representing the dissociation of hydrogen at a height of 5 mm above the substrate.

In FIG. 5, the degree of dissociation of hydrogen at a height of 5 mm above the substrate 2 and the thermal diffusivity (corresponding to the purity of the synthesized diamond film) are plotted against the electrical current passed between the annular positive electrode 31 and the rodlike electrode 7. The degree of dissociation is represented as the emission intensity of hydrogen radicals measured by emission spectral analysis. As can be seen from FIG. 5, as the electrical current increases, the dissociation of hydrogen is promoted. As a result, the purity of the diamond film is also improved. In addition, the purity of diamond is enhanced greatly where the electrical current passed through the plasma by the positive electrode 31 exceeds about 20 A. In the above embodiment, the maximum diameter of the plasma jet gas is about 20 mm. Since the positive electrode 31 is disposed around the position at which the plasma jet gas assumes its maximum diameter, the purity of the synthesized diamond is improved greatly by setting the current density to at least 5 A/cm$^2$.

In the present embodiment, the inside diameter A of the annular positive electrode 31 and the inside diameter B of the plasma ejection port 18 are so set that the relationship $A \leq 5B$ holds, for the reason described now. In the present embodiment, the annular positive electrode 31 is disposed at or near the position at which the diameter of the plasma jet pillar takes its maximum value, to permit the plasma jet pillar of the raw material gases to pass through the annular electrode 31. In this way, a large number of electrons flow through the plasma jet pillar.

Figure 7:
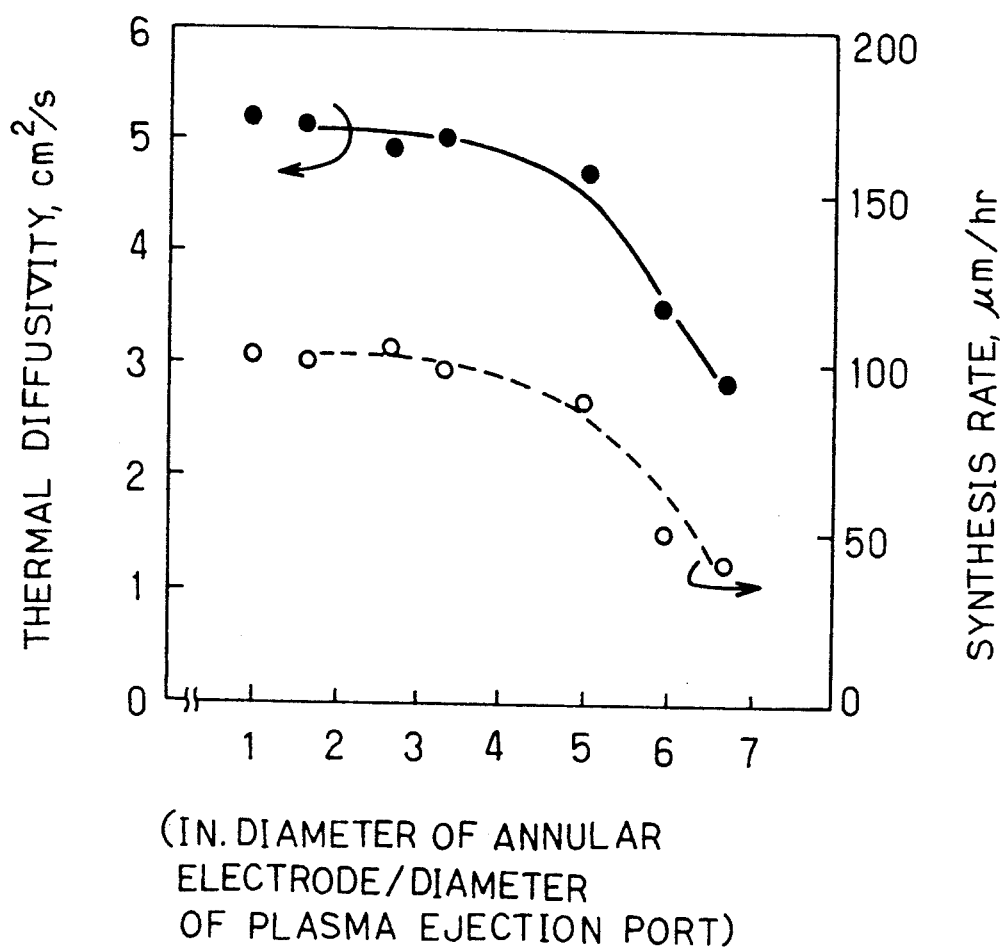
FIG. 7 is a graph in which the thermal diffusivity of a synthesized diamond film and the synthesis rate are plotted against the ratio of the inside diameter of the annular positive electrode of the apparatus shown in FIG. 1 to the diameter of the plasma ejection port.

We conducted numerous experiments and have discovered that the synthesis rate of the diamond film and the thermal diffusivity are varied by changing the ratio of the inside diameter of the annular positive electrode 31 to the inside diameter of the plasma ejection port 18 and that limitations are imposed on the inside diameter of the positive electrode 31. These characteristics and relation are shown in FIG. 7. As can be seen from this graph, the synthesis rate of the diamond film and the thermal diffusivity corresponding to the purity of the diamond film drop rapidly when the ratio of the inside diameter of the annular positive electrode 31 to the inside diameter of the plasma ejection port 18 exceeds 5. That is, in order that a large number of electrons flow through the plasma, the inside diameter A of the annular positive electrode 31 and the inside diameter B of the plasma ejection port 18 must satisfy the relation $A \leq 5B$. If the inside diameter of the annular electrode 31 is so large that this relation is not adhered to, then it is difficult to pass electrons through the plasma. In this case, the object of the present embodiment is not achieved. The present embodiment is intended to promote the decomposition of the raw material gases by providing the annular positive electrode 31 and passing a large number of electrons through the plasma jet pillar.

As described thus far, in the present embodiment, electrons are passed through the plasma between the region in which the gas plasma is produced and the positive electrode located above the substrate such that this positive electrode acting to supply an electrical current into the plasma is placed at a higher potential. Therefore, the decomposition of the raw material gases is accelerated greatly. Also, recombined atoms of the raw material gases can be broken down again. Since the substrate is placed at ground potential, an increase in the substrate temperature due to the electrical current flowing through the plasma is prevented. In this way, a diamond film of high purity can be formed at a higher synthesis rate. Furthermore, since the lower limit of the electrical current flowing through the plasma is set, the decomposition rate of gases around the substrate can be increased sufficiently without the need to place the positive electrode for supplying the electrical current into the plasma close to the substrate. Hence, a diamond film of high purity can be synthesized at a high rate and at a high efficiency. Further, a large number of electrons can be passed through the plasma easily, because the inside diameter A of the annular positive electrode and the diameter B of the restrictor of the plasma ejection port are so set that the relation A üa 5B holds. Moreover, the decomposition factor near the substrate can be increased sufficiently. In consequence, a high-quality diamond film can be synthesized at a high rate and at a high efficiency.

Figure 8:
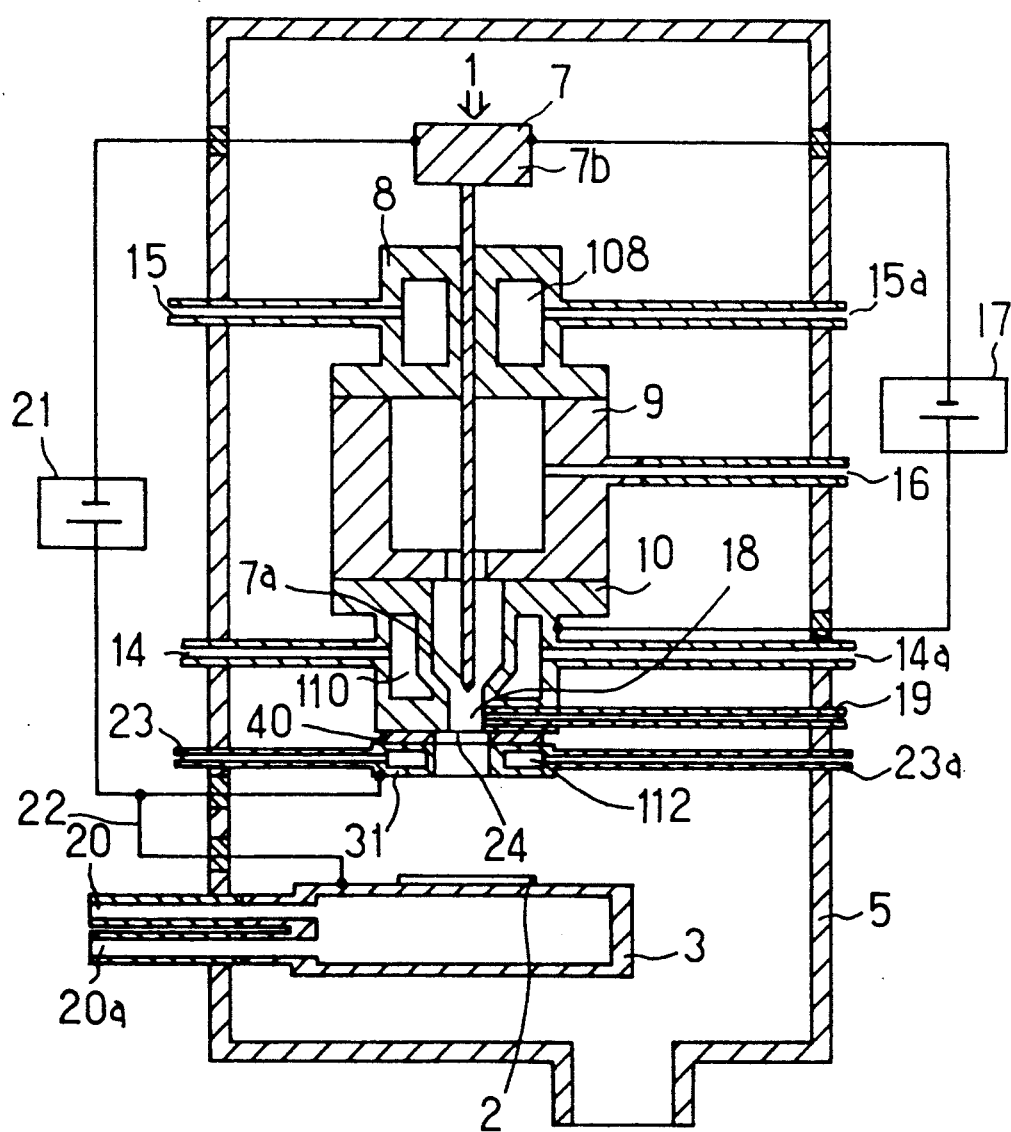
FIGS. 8, 9, 10, 11, and 12 are cross-sectional views of other apparatuses according to the invention for synthesizing a diamond film.

While the first embodiment of the invention has been described, the present invention is not limited to it but rather various changes and modifications are possible without departing from the spirit and scope of the invention. In the first embodiment described above, the substrate 2 is placed at ground potential. This is intended to prevent an increase in the substrate temperature due to the electrons reaching the substrate. A second embodiment of the invention is shown in FIG. 8, where the substrate is placed at the same potential as the annular positive electrode 31 by the conductor 22, or the inhibiting means. Alternatively, a power supply for placing the substrate at a lower potential than the plasma current-supplying positive electrode to place the positive electrode at a higher potential than the substrate is connected with the substrate support. It is to be noted that like components are indicated by like reference numerals in various figures.

Figure 9:
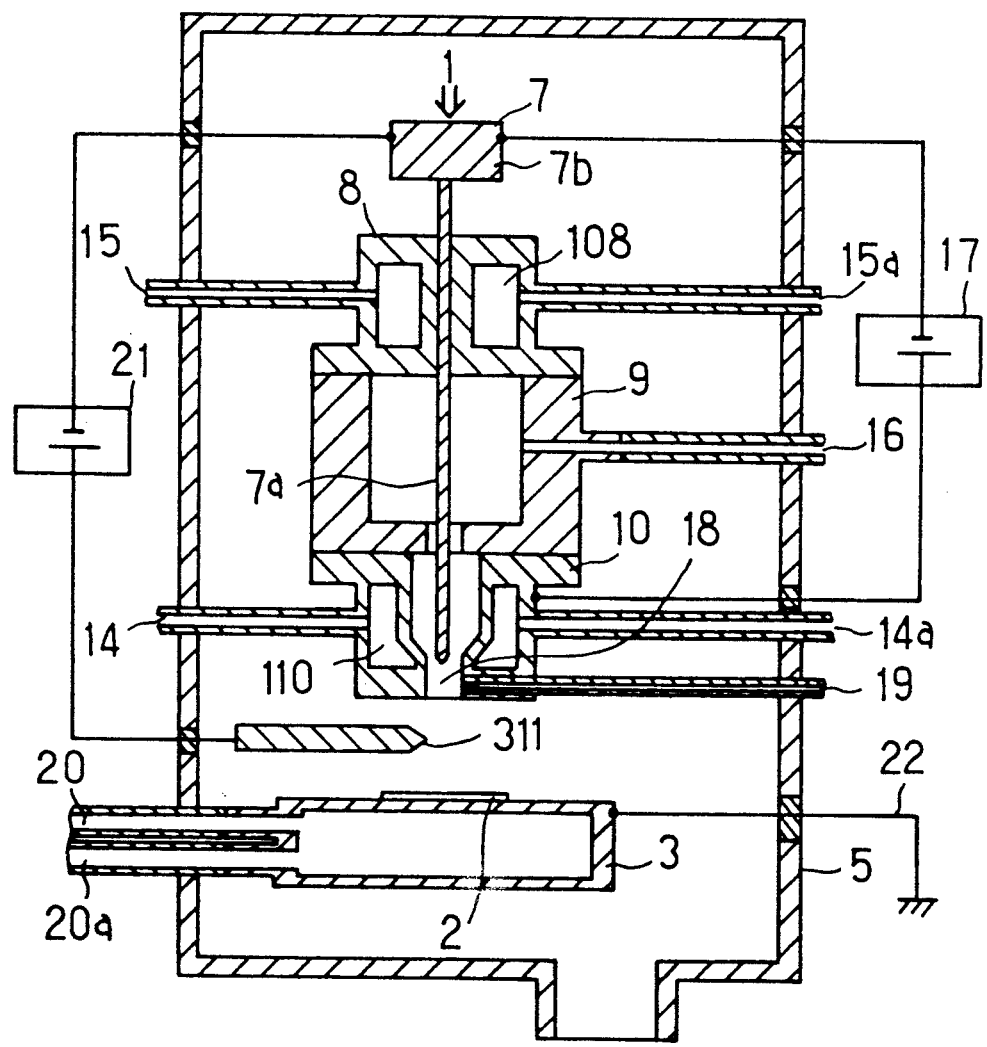

Referring to FIG. 9, there is shown a third embodiment of the novel diamond film-fabricating apparatus. In the first and second embodiments, the annular positive electrode 31 is used as the third electrode for passing an electrical current through the plasma. As shown in FIG. 9, a simple rodlike positive electrode 311 is used instead.

Figure 10:
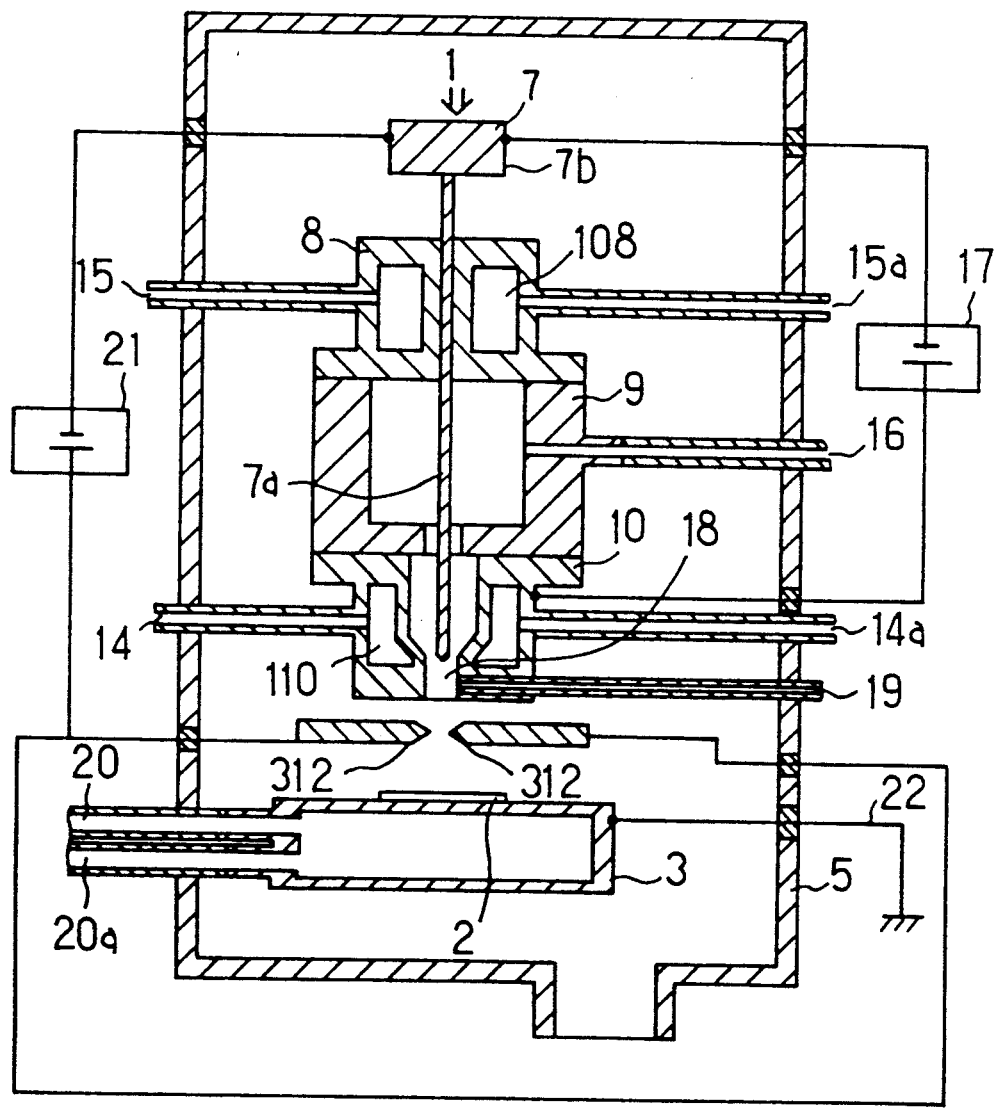

Referring next to FIG. 10, there is shown a fourth embodiment of the invention. The third electrode for passing an electrical current through the plasma comprises at least two opposite positive electrodes 312.

In the various embodiments described above, the negative or lower potential side of the plasma current power supply 21 is connected with the rodlike electrode 7. The negative potential side may also be connected with the cylindrical electrode 10. In the first embodiment described above, the annular positive electrode 31 is connected with the plasma jet gun 1 via the insulator 40. It is only necessary that the annular electrode 31 be electrically insulated from the plasma ejection port 18. The annular electrode 31 may also be held in the space between the plasma ejection port 18 and the substrate 2 with the insulator 40 omitted.

Figure 11:
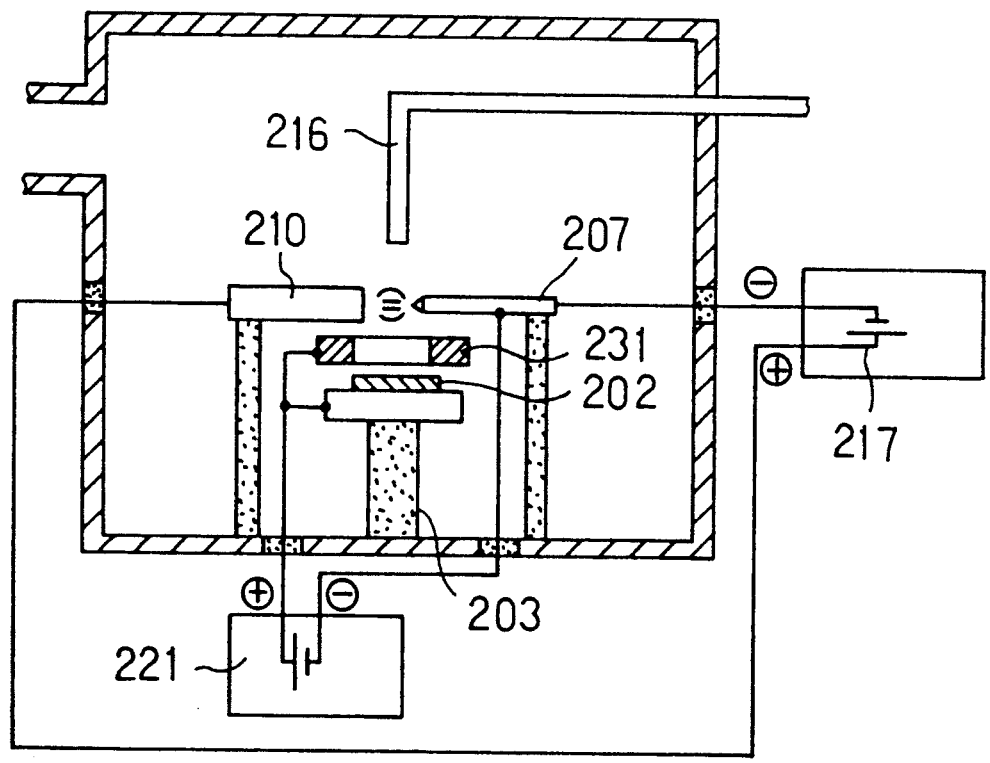

Referring next to FIG. 11, there is shown a fifth embodiment of the invention. In the various embodiments described above, an arc discharge plasma jet is utilized. In FIG. 11, an arc discharge is applied with equal utility. Specifically, an arc discharge power supply 217 produces an arc discharge between opposite electrodes 210 and 207. A mixture gas of hydrogen, methane, and argon, i.e., raw material gases containing a plasma source gas and a carbon source gas, is introduced from a raw material gas inlet pipe 216 at the same proportions and at the same f low rate as in the first embodiment. An electric field is applied between a third electrode 231 and the electrode 207 or 210 by a plasma current power supply 221. A diamond film is synthesized under the same conditions as in the first embodiment. We have confirmed that a high-purity diamond film can be synthesized in the same manner as in the first embodiment.

In the various embodiments described above, the negative or lower potential side of the plasma current power supply is connected with the positive or negative electrode for inducing an arc discharge to place the substrate at a potential lower than the third electrode, thus preventing flow of the positive current into the third electrode. An increase in the substrate temperature due to the electrical current flowing through the plasma can also be prevented by making the sense of the electrical current flowing into the plasma from the third electrode intersect the flow of the plasma.

Figure 12:
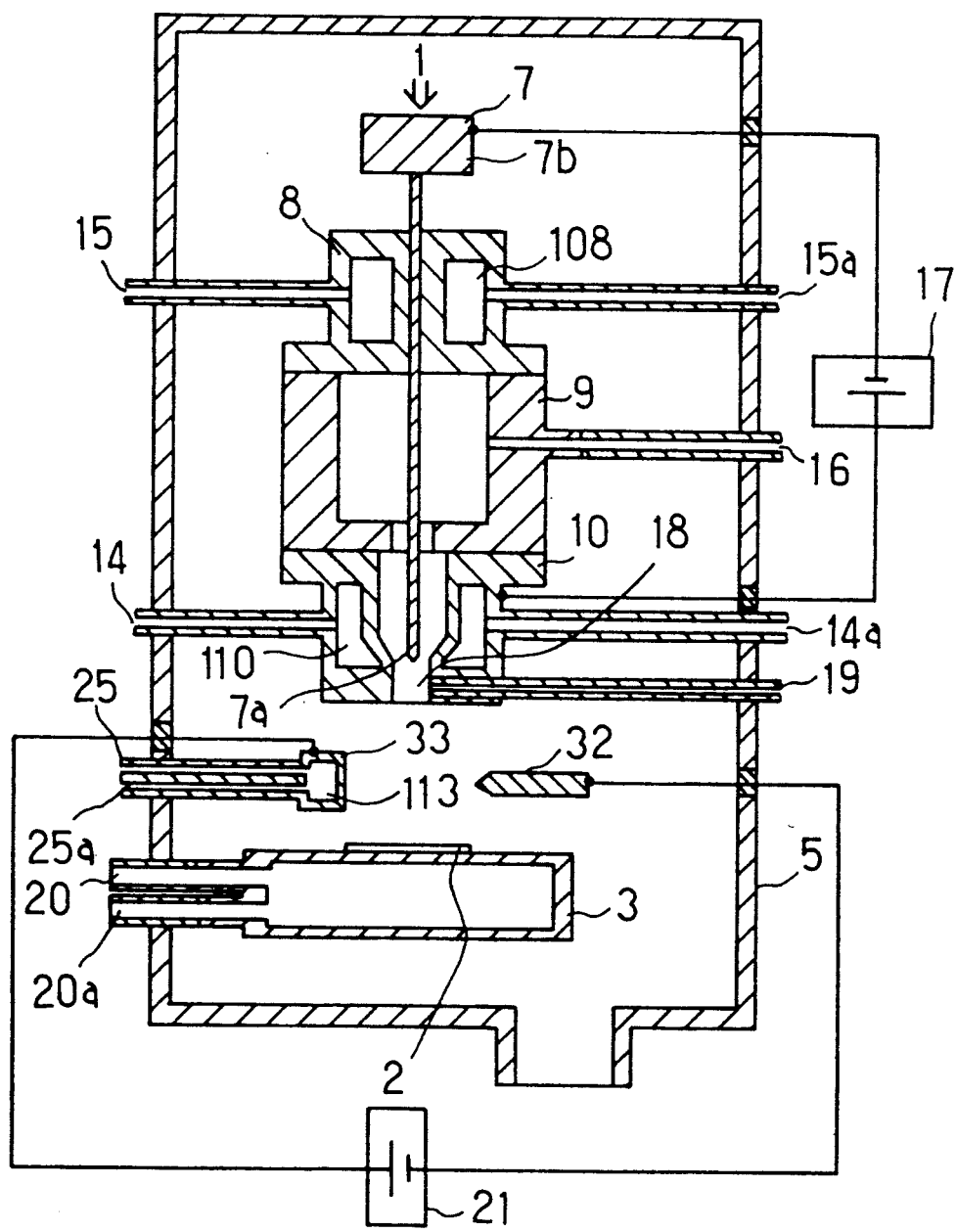

FIG. 12 is a cross-sectional view of a sixth embodiment of the invention. This embodiment is similar to the first embodiment except, for the following points. A pair of opposite electrodes 32 and 33 are disposed in the space between the plasma ejection port 18 and the substrate 2 on opposite sides of the plasma jet emitted from the ejection port 18 on a plane parallel to the substrate 2. The plasma current power supply 21 that is a DC power supply is electrically connected between the opposite electrodes 32 and 33 to apply an electric field between the opposite electrodes 32 and 33, for passing an electrical current between these electrodes via the plasma. The negative one 32 of the opposite electrodes acts as an inhibiting means, has a sharp end, and is made of tungsten. The positive one 33 of the opposite electrodes serves as a third electrode and is made of copper. The positive electrode 33 has a hollow portion 113. A cooling water pipe 25 is connected to the positive electrode 33. Cooling water supplied from the cooling water pipe 25 passes through the hollow portion 113 of the positive electrode 33 and then is discharged into the cooling water pipe 25a. In this manner, the positive electrode 33 is cooled. Consequently, it is unlikely that the heat produced by the electrical current flowing between the positive electrode 33 and the opposite negative electrode 32 from wearing away the positive electrode.

The distance between the opposite electrodes 32 and 33 is set smaller than the diameter of the plasma jet. In this configuration, the ends of the electrodes 32 and 33 are inserted in the plasma jet. This facilitates the electrical energization of the plasma jet. It is to be noted that FIG. 12 is a schematic view, where the distances are not drawn exactly. Diamond can be synthesized where the distance between the opposite electrodes 32 and 33 is set to 2 to 50 mm and the distance between the substrate 2 and the surface on which the opposite electrodes 32, 33 are installed is set to 1 to 100 mm. In the present embodiment, the distance between the opposite electrodes 32 and 33 is 15 mm. The distance between the substrate 2 and the surface on which the opposite electrodes 32, 33 are installed is 20 mm. The distance between the plasma ejection port 18 and the substrate 2 is 40 mm. A diamond film is synthesized under the same conditions as in the first embodiment, the conditions including the flow rates of gases and arc-discharge conditions. The plasma current power supply 21 applies a voltage of 100 V. An electrical current of 20 A is passed through the plasma.

Figure 13:
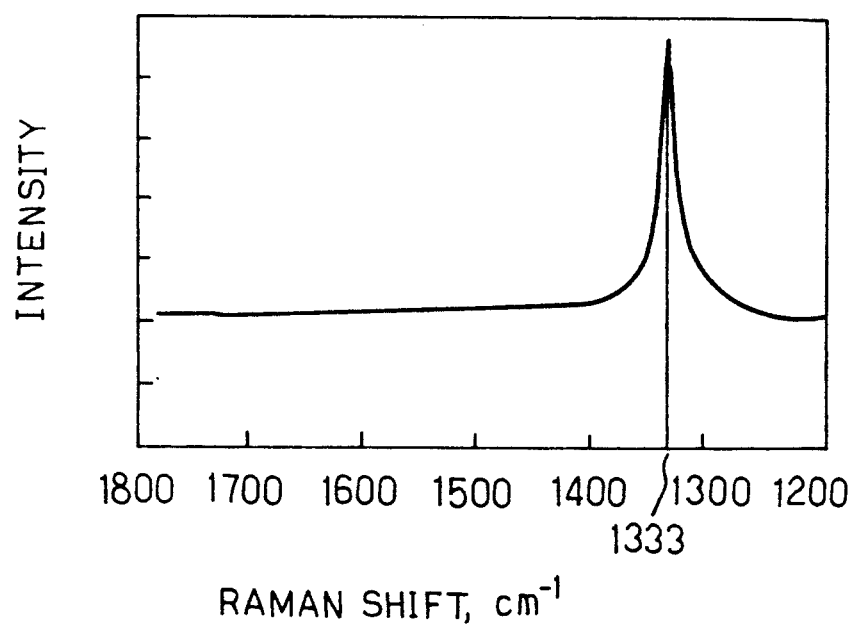
FIG. 13 is a graph showing a Raman spectrum obtained from a sample synthesized by the apparatus shown in FIG. 12.

We synthesized diamond for 30 minutes in practice in the same way as in the first embodiment. Then, the deposit on the substrate 2 was evaluated. As shown in FIG. 13, we could confirm that high-purity diamond could be synthesized by the present apparatus in the same manner as in the first embodiment.

We performed an experiment for synthesizing a diamond film by the known microwave plasma CVD. The synthesis rate was 0. 3 μm/h. The synthesis rate achieved by the present embodiment was 50 μm/h. In this way, a diamond film can be formed at a sufficiently high speed in the present embodiment.

In the present embodiment, an electric field is applied between the opposite electrodes 32 and 33 to accelerate electrons toward the positive electrode 33 which flow through the gas plasma. As a result, the electrons possess higher energies. These electrons collide against hydrogen and hydrocarbons. The energies of the electrons are therefore absorbed by the hydrogen and hydrocarbons. Consequently, the hydrogen and hydrocarbons can be easily decomposed and dissociated. This permits a high-purity diamond film to be deposited at a high rate.

Figure 14:
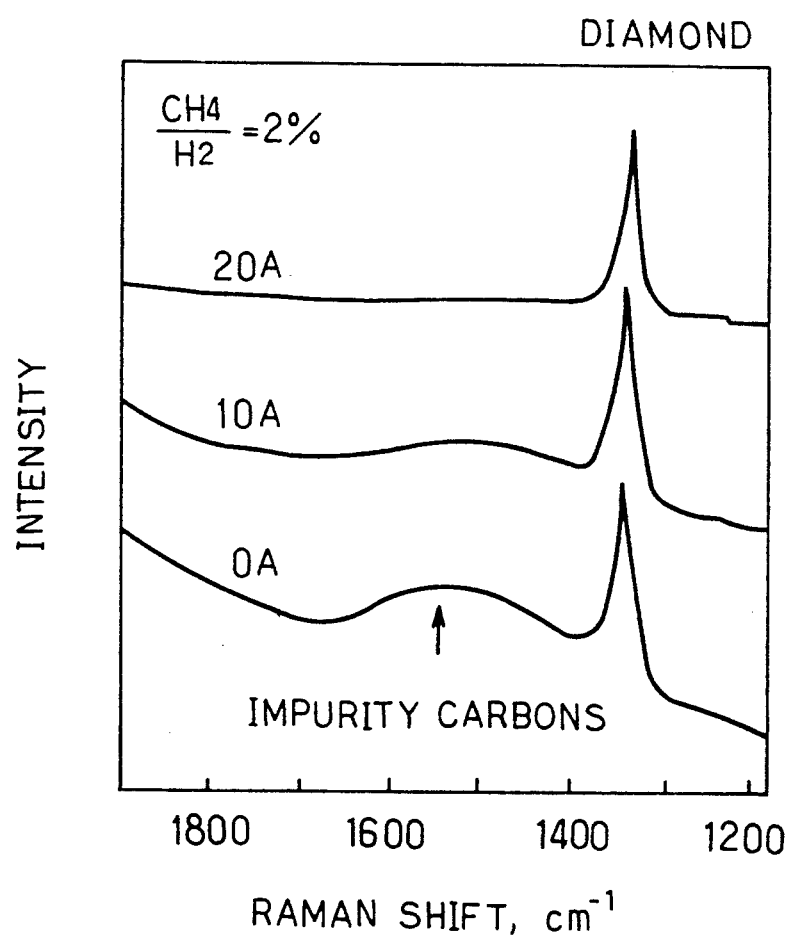
FIG. 14 is a graph showing Raman spectra obtained from samples synthesized by the apparatus shown in FIG. 12 with various values of the electrical current flowing into the gas plasma.

FIG. 14 shows Raman spectra obtained with various values of the electrical current passed between the opposite electrodes 32 and 33. As can be seen from this graph, the broad peak at 1400 to 1600 cm$^{-1}$ hardly appears when the passed current is in excess of 10 A. Hence, a diamond film of high purity is derived.

Figure 15:
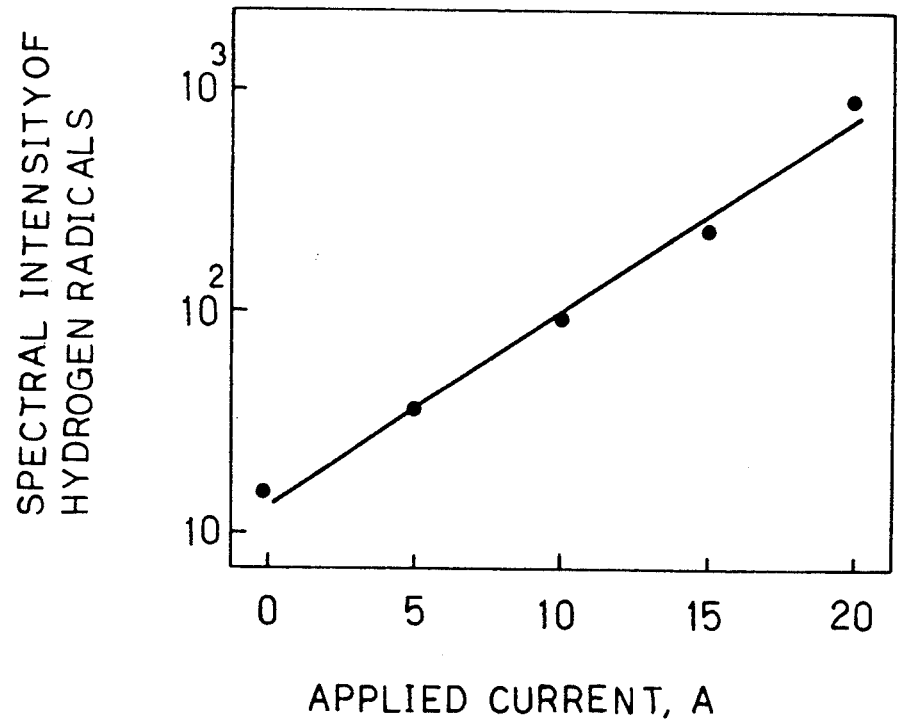
FIG. 15 is a graph in which the intensity of a hydrogen spectrum obtained from a sample synthesized by the apparatus shown in FIG. 12 is plotted against the electrical current supplied into the plasma, the spectrum intensity representing the dissociation of hydrogen at a height of 5 mm above the substrate.

The electrical current is passed through the plasma. Advantages can be obtained where the value of the current exceeds 1 A. As the current value increases, the purity of the deposited diamond film and the synthesis rate are improved. FIG. 15 shows the relation between the intensity of the light emitted by hydrogen radicals and the passed electrical current, the light being measured at a height of 5 mm above the substrate 2. It can be seen that the amount of the existing hydrogen radicals increases with increasing the electrical current. That is, passage of electrical current through the gas plasma increases the amount of hydrogen dissociation near the substrate, which in turn improves the capability to remove carbons other than diamond such as graphite, amorphous carbon, and i-carbon. As a result, the purity of the diamond can be improved.

The surface on which the opposite electrodes 32 and 33 are installed is parallel to the substrate 2 and, therefore, the direction of acceleration of electrons is vertical to the flow of plasma. For this reason, if the electrical current passed through the plasma is increased, it is unlikely that the accelerated electrons reach the substrate 2 to thereby elevate the substrate temperature above the aforementioned diamond synthesis region from 600° C. to 1100° C.

Since the opposite electrodes 32 and 33 are exposed to the plasma, we consider that the dissociation of the raw material gases including hydrogen and hydrocarbon occurs principally on the straight line connecting both electrodes. That is, on the substrate 2 that is located immediately downstream of the straight line connecting both electrodes 32 and 33 within the plasma jet, the synthesis rate and the purity of the diamond film are especially improved.

As described thus far, in the present embodiment, the gases can be sufficiently decomposed around the substrate by passing an electrical current through the plasma. A diamond film of high purity can be formed at a high rate. In this case, at least one pair of opposite electrodes disposed on opposite sides of the gas plasma are used. In this way, the diamond film formed on the substrate located downstream of the plasma stream on the straight line connecting the electrodes is superior in synthesis rate and purity to diamond film formed in the other regions. Thus, a diamond film can be formed either on desired portions of the substrate or in conformity with the shape of the outer periphery of the substrate such as a rectangle or ellipse with partially improved synthesis rate and purity.

Figure 16:
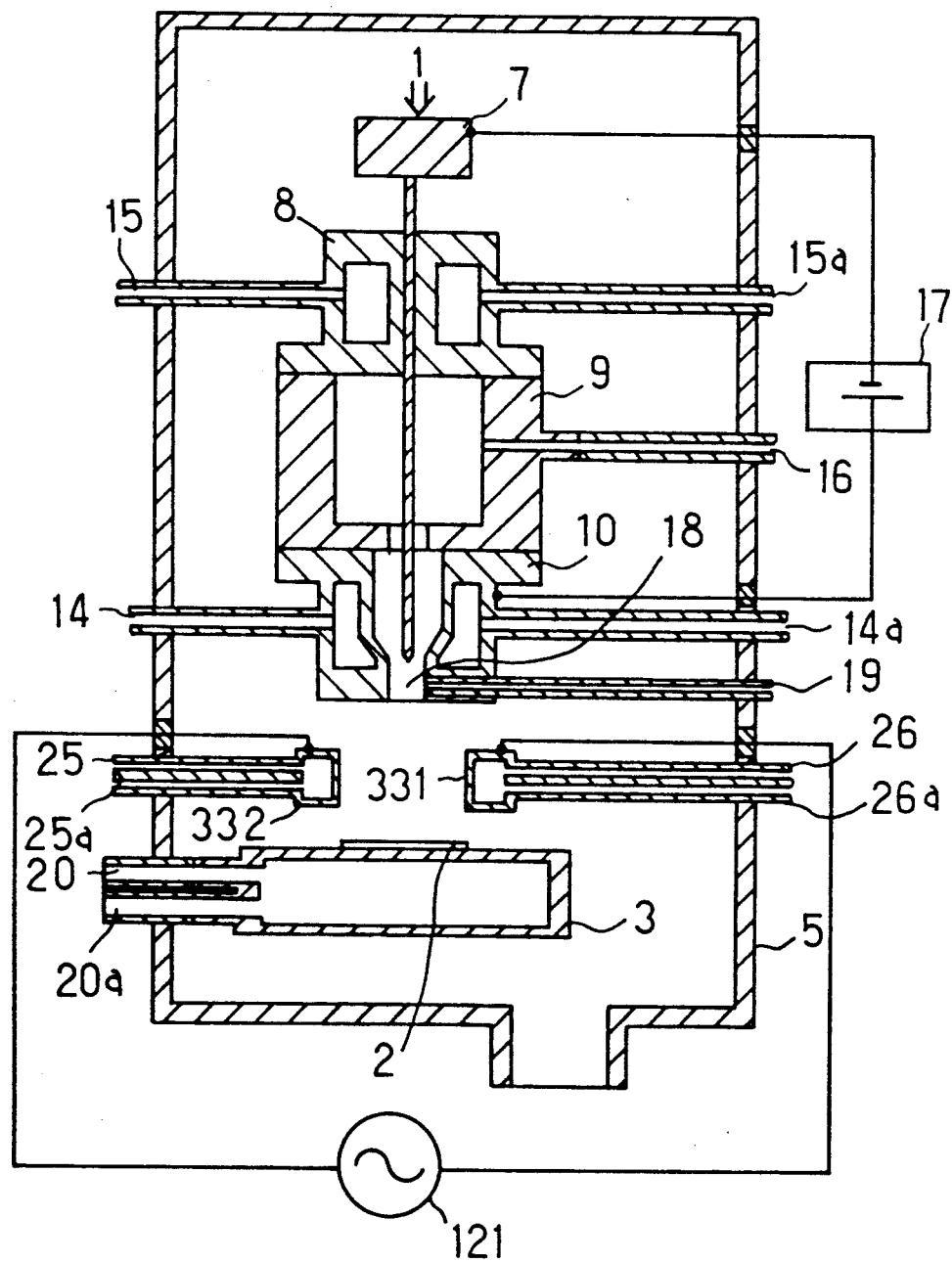
FIG. 16 is a cross-sectional view of a further apparatus according to the invention for synthesizing a diamond film.

Referring next to FIG. 16, there is shown a seventh embodiment of the invention. In the above-described sixth embodiment, a DC power supply is used as the plasma current power supply 21 between the opposite electrodes 32 and 33. In FIG. 16, an AC power supply is used as a plasma current power supply 121 to apply an alternating electric field between opposite electrodes 331 and 332. The electrode 331 has a hollow portion in the same way as the electrode 332. Cooling water is supplied-into the electrode 331 from cooling water pipes 26 and 26a. This embodiment is similar to the sixth embodiment except for these points.

In the present embodiment, an AC power supply is employed as the plasma current power supply 121 to apply an alternating electric field between the opposite electrodes 331 and 332. However, electrons are accelerated between the electrodes and so hydrogen and hydrocarbon are easily dissociated. That is, the present embodiment yields the same advantages as the sixth embodiment.

We synthesized a diamond film with an apparatus of this embodiment. We confirmed that a diamond film having a purity comparable to that of the diamond film formed in the sixth embodiment was synthesized. This diamond film was formed under the same conditions as in the sixth embodiment. The distance between the opposite electrodes 331 and 332 is 8 mm. The electrical current passed through the plasma is 10 A.

Figure 17:
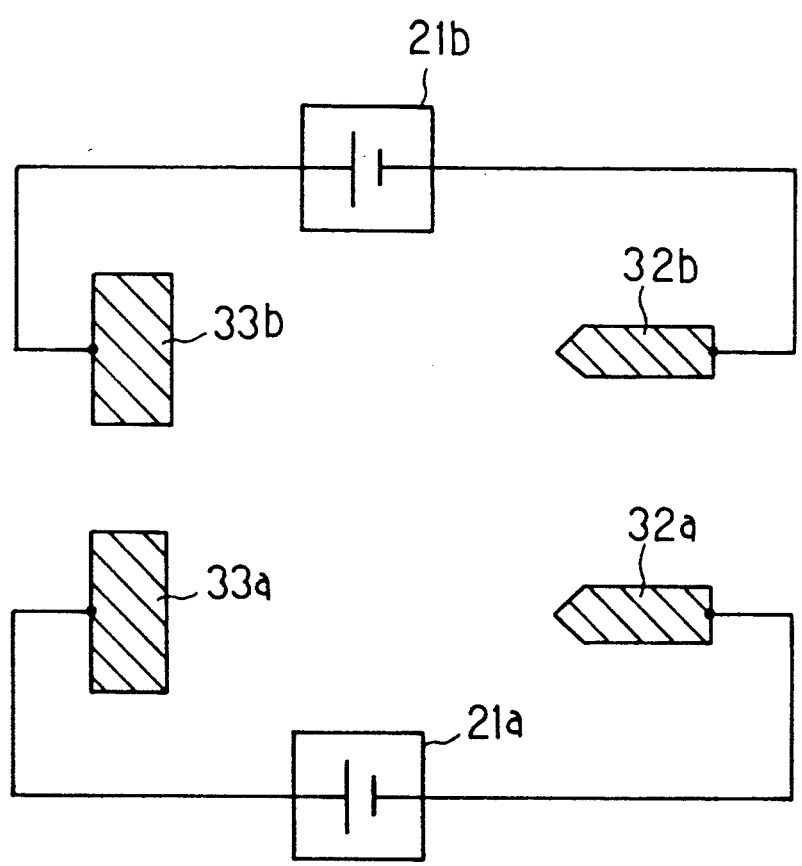
FIG. 17 is a schematic diagram showing the arrangement of opposite electrodes for supplying electrical currents into a plasma in yet another apparatus according to the invention.
Figure 18:
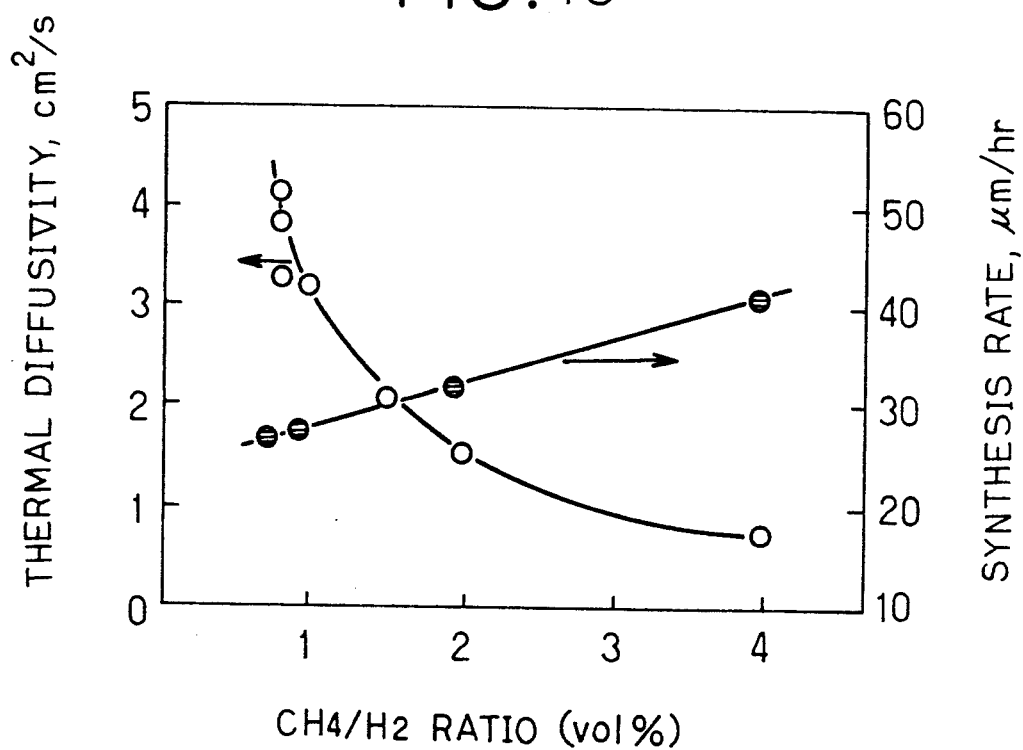
FIG. 18 is a graph in which the thermal diffusivity of diamond synthesized by a known process and the synthesis rate are plotted against the ratio of $CH_4$ to $H_2$.
Figure 19:
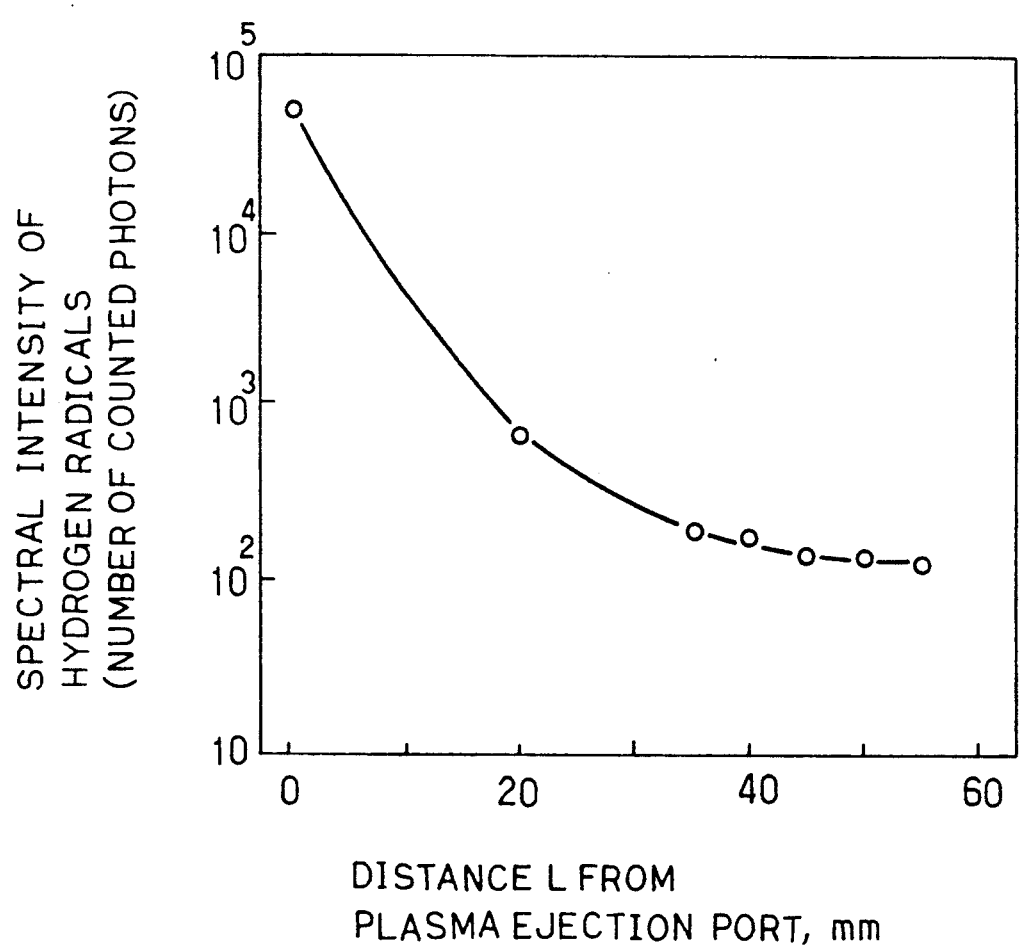
FIG. 19 is a graph in which the spectral intensity of hydrogen radicals produced in the known process is plotted against the distance from the plasma ejection port.

Referring to FIG. 17, there is shown an eighth embodiment of the invention. FIG. 17 is a schematic view showing the arrangement of opposite electrodes for passing an electrical current through a plasma. This figure is a top view of the surface having the opposite electrodes installed, the surface being parallel to the surface of the substrate on which a diamond film is synthesized. In the sixth and seventh embodiments, a pair of opposite electrodes are provided. In the present embodiment, two pairs of opposite electrodes are arranged parallel to each other. More specifically, one pair of opposite electrodes 32a and 33a are supplied with electrical current from a first plasma current power supply 21a. Another pair of opposite electrodes 32b and 33b are supplied with electrical current from a second plasma current power supply 21b.

In this way, electrical current is supplied into the plasma from plural locations. Therefore, dissociation of the raw material gases within the plasma jet takes place at plural locations. This improves the synthesis rate and the purity of the diamond film in the corresponding regions on the substrate surface located downstream of the plasma jet. We synthesized a diamond film in practice and have confirmed that a diamond film of a high purity comparable to the purity achieved in the sixth and seventh embodiments are formed at certain locations on the substrate. , The diamond film was synthesized under the same conditions as in the sixth embodiment. The distance between the positive and negative electrodes of each pair was 15 mm. The distance between the two pairs of opposite electrodes was 10 mm. An electrical current of 5 A was supplied into the plasma from each pair.

In the sixth through eighth embodiments, the opposite electrodes for passing an electrical current through the plasma are stationary. It is also possible that they can vertically move. Furthermore, the opposite electrodes may rotate around the gas plasma current. In this way, the synthesis rate and the purity can be improved over a wider region on the substrate. Additionally, the surface on which the opposite electrodes are installed is not always required to be parallel to the substrate surface. The former surface may be inclined at a desired angle to the substrate surface. Also, the angle may be varied at will. In summary, the requirement is that an electric field directed so as to intersect the plasma flow is applied to pass an electrical current through the gas plasma.

What is claimed is:

1. An apparatus for forming a diamond film, comprising:
    a vacuum vessel the inside of which is maintained at a given degree of vacuum;
    a positive electrode and a negative electrode which are disposed opposite to each other inside the vacuum vessel;
    an arc discharge power supply which is electrically connected with the positive and negative electrodes to supply a given electric power into the space between the positive and negative electrodes to produce an arc discharge in the space;
    a gas supply means which supplies raw material gases including hydrogen and carbon containing gas into the arc discharge to produce a gas plasma and which blows this gas plasma against a substrate located downstream of the gas plasma;
    a third electrode disposed between the substrate and the region in which the gas plasma is produced;
    a plasma current power supply for passing an electrical current from the third electrode into the gas plasma; and
    an inhibiting means which inhibits flow of positive electrical current from the substrate to the third electrode.

2. An apparatus for forming a diamond film as set forth in claim 1, wherein the direction of the flow of electrical current from the third electrode into the gas plasma is substantially parallel to the flow of the gas plasma, and wherein said inhibiting means is a substrate potential-setting means which sets the potential of the substrate in such a way that the flow of positive electrical current from the substrate to the third electrode is inhibited.

3. An apparatus for forming a diamond film as set forth in claim 2, wherein said substrate potential-setting means places the substrate at the same potential as the third electrode.

4. An apparatus for forming a diamond film as set forth in claim 2, wherein said substrate potential-setting means places the substrate at a lower potential than the third electrode.

5. An apparatus for forming a diamond film as set forth in claim 4, wherein said substrate potential-setting means places the substrate at ground potential.

6. An apparatus for forming a diamond film as set forth in claim 1, wherein said inhibiting means is a fourth electrode which is in opposed facing relation to the third electrode, said fourth electrode being disposed such that and connected with the plasma current power supply such that the direction of the flow of electrical current from the third electrode into the gas plasma intersects the flow of the gas plasma.

7. An apparatus for forming a diamond film, comprising:
    a vacuum vessel the inside of which is maintained at a given degree of vacuum;
    a positive electrode and a negative electrode which are disposed opposite to each other inside the vacuum vessel;
    an arc discharge power supply which is electrically connected with the positive and negative electrodes to supply a given electric power into the space between the positive and negative electrodes to produce an arc discharge in the space;

a gas supply means which supplies raw material gases including hydrogen and carbon containing gas into the arc discharge to produce a gas plasma and which blows this gas plasma against a substrate located downstream of the gas plasma;

a third electrode disposed between the substrate and the region in which the gas plasma is produced;

a plasma current power supply for passing an electrical current from the third electrode to the positive or negative electrode via the gas plasma; and a substrate potential-setting means which sets the potential of the substrate in such a way that the third electrode is placed at the same potential as the substrate or at a higher potential than the substrate, to inhibit flow of positive electrical current from the substrate to the third electrode.

8. An apparatus for forming a diamond film as set forth in claim 7, wherein said third electrode is annular, and wherein said gas plasma containing a carbon source gas is blown against the substrate through the annular third electrode.

9. An apparatus for forming a diamond film as set forth in claim 8, wherein an insulator is disposed between the positive or negative electrode and the third electrode around the flow of the gas plasma so that an electrical current may flow from the third electrode to the positive or negative electrode via the gas plasma.

10. An apparatus for forming a diamond film as set forth in claim 8, wherein the distance of the third electrode from the substrate is so set that increase in the temperature of the substrate due to the electrical current passed through the gas plasma is prevented, and wherein the electrical current passed through the gas plasma by the plasma current power supply is set larger than about 20 A.

11. An apparatus for forming a diamond film as set forth in claim 7, wherein the distance of the third electrode from the substrate is so set that increase in the temperature of the substrate due to the electrical current passed through the gas plasma is prevented, and wherein the electrical current passed through the gas plasma by the plasma current power supply is set larger than about 20 A.

12. An apparatus for forming a diamond film, comprising:

a vacuum vessel the inside of which is maintained at a given degree of vacuum;

a positive electrode and a negative electrode which are disposed opposite to each other inside the vacuum vessel;

an arc discharge power supply which is electrically connected with the positive and negative electrodes to supply a given electric power into the space between the positive and negative electrodes to produce an arc discharge in the space;

a gas supply means which supplies raw material gases including hydrogen and carbon containing gas into the arc discharge to produce a gas plasma;

a gas plasma ejection means which narrows down the flow of the gas plasma and blows the gas plasma as a plasma jet against a substrate located downstream of the gas plasma; an annular positive electrode through which the plasma jet passes and which is disposed at or near the position where the plasma jet assumes its maximum diameter between the substrate and the region in which the gas plasma is produced, the inside diameter A of the annular positive electrode being so set that the relation $A \leq 5B$ holds, where B is the diameter of the restrictor of the gas plasma ejection means;

a plasma current power supply for passing an electrical current from the annular positive electrode into the plasma jet to promote decomposition of the raw material gases; and a substrate potential-setting means which sets the potential of the substrate in such a way that the annular positive electrode is placed at the same potential as the substrate or at a higher potential than the substrate, to inhibit flow of positive electrical current from the substrate to the annular positive electrode.

13. An apparatus for forming a diamond film as set forth in claim 12, wherein the distance of the annular positive electrode from the substrate is so set that increase in the substrate temperature due to the electrical current passed through the gas plasma by the plasma current power supply is prevented, and wherein the electrical current passed through the gas plasma by the plasma current power supply is set larger than about 20 A.

14. An apparatus for forming a diamond film, comprising:

a vacuum vessel the inside of which is maintained at a given degree of vacuum;

a positive and a negative electrodes which are disposed opposite to each other inside the vacuum vessel;

an arc discharge power supply which is electrically connected with the positive and negative electrodes to supply a given electric power into the space between the positive and negative electrodes to produce an arc discharge in the space;

a gas supply means which supplies raw material gases including hydrogen and carbon containing gas into the arc discharge to produce a gas plasma and which blows this gas plasma against a substrate located downstream of the gas plasma;

at least one, pair of opposite electrodes disposed on opposite sides of the flow of the gas plasma directed toward the substrate between the substrate and the region in which the gas plasma is produced; and a plasma current power supply which applies an electric field between the opposite electrodes to pass an electrical current through the gas plasma in a direction intersecting the flow of the gas plasma.

15. An apparatus for forming a diamond film as set forth in claim 14, wherein said opposite electrodes can be moved relative to the substrate around the flow of the gas plasma.

16. An apparatus for forming a diamond film as set forth in claim 14, wherein the electrode surfaces of the opposite electrodes are exposed to the flow of the gas plasma.

17. An apparatus for forming a diamond film as set forth in claim 14, wherein said plasma current power supply is a DC power supply which applies a DC electric field between the opposite electrodes.

18. An apparatus for forming a diamond film as set forth in claim 14, wherein said plasma current power supply is an AC power supply which applies an alternating electric field between the opposite electrodes.

* * * * *